(12) United States Patent
Harper et al.

(10) Patent No.: US 11,262,412 B2
(45) Date of Patent: Mar. 1, 2022

(54) BATTERY MONITORING AND TESTING SYSTEM AND METHODS THEREOF

(71) Applicant: ADVANCED MEASUREMENT TECHNOLOGY INC, Oak Ridge, TN (US)

(72) Inventors: John Christopher Harper, Leamington Spa (GB); Oliver James Curnick, West Midlands (GB); Jonathan Edward Harrisson Sansom, East Sussex (GB)

(73) Assignee: Advanced Measurement Technology, Inc., Oak Ridge, TN (US)

( * ) Notice: Subject to any disclaimer, the term of this patent is extended or adjusted under 35 U.S.C. 154(b) by 0 days.

(21) Appl. No.: 16/846,647

(22) Filed: Apr. 13, 2020

(65) Prior Publication Data

US 2020/0386820 A1 Dec. 10, 2020

Related U.S. Application Data

(60) Provisional application No. 62/832,354, filed on Apr. 11, 2019.

(51) Int. Cl.
*G01R 31/389* (2019.01)
*G01R 31/392* (2019.01)
*G01R 31/3835* (2019.01)
*G01R 31/367* (2019.01)
*G01R 31/374* (2019.01)

(52) U.S. Cl.
CPC ......... *G01R 31/389* (2019.01); *G01R 31/367* (2019.01); *G01R 31/374* (2019.01); *G01R 31/3835* (2019.01); *G01R 31/392* (2019.01)

(58) Field of Classification Search
None
See application file for complete search history.

(56) References Cited

U.S. PATENT DOCUMENTS

| | | |
|---|---|---|
| 5,773,978 A | 6/1998 | Becker |
| 6,424,157 B1 | 7/2002 | Gollomp |
| 2007/0257681 A1 | 11/2007 | Christopherson et al. |
| 2009/0146664 A1 | 11/2009 | Zhang |
| 2013/0069660 A1* | 3/2013 | Bernard ............... G01R 31/367 324/430 |

OTHER PUBLICATIONS

Patent Cooperation Treaty, International Searching Authority; Int'l Search Report; dated Jul. 2, 2020; form PCT/ISA/220.

* cited by examiner

*Primary Examiner* — Jas A Sanghera
(74) *Attorney, Agent, or Firm* — Pitts & Lake, P.C.

(57) ABSTRACT

Systems and methods of monitoring and testing a battery module, including generating Electrochemical Impedance Spectra (EIS) of one or more battery modules, fitting the EIS spectra to an equivalent circuit model to establish equivalent circuit fit parameters, measuring an open circuit voltage of the one or more battery modules, measuring a temperature of the one or more battery modules, combining the EIS equivalent circuit fit parameters with measured open circuit and temperature values to determine weighting parameters of the equivalent circuit fit parameters, applying the weighting parameters to the equivalent circuit fit parameters to generate weighted equivalent circuit fit parameters, and generating a state-of-health (SoH) measurement of the one or more battery modules based on the weighted equivalent circuit fit parameters.

18 Claims, 5 Drawing Sheets

BATTERY MONITORING AND TESTING SYSTEM AND METHODS THEREOF

CROSS-REFERENCE TO RELATED APPLICATIONS

This application claims the benefit of U.S. Provisional Patent Application No. 62/832,354, filed on Apr. 11, 2019.

FIELD OF INVENTION

The present general inventive concept relates to systems and methods of measuring, testing, and analyzing the residual capacity or state of health (SoH) of power storage devices, such as battery modules for electric vehicles.

BACKGROUND

Batteries in electric vehicles have a limited lifespan due to the degradation of materials over time and as a function of normal operation. Usually, the loss in capacity over time is measured as the State of Health of the battery (SoH) and is expressed as a percentage of the initial charge capacity of the battery.

Electric vehicle (EV) applications demand consistent range between charges and therefore batteries are considered at the end of life when the SoH reaches a threshold value. Whilst this value is manufacturer or OEM dependent, typically a battery is deemed unfit for EV purpose when the SoH is less than 80%.

There is significant residual capacity left in the battery that can be utilized to perform other energy storage functions such as grid tied uninterruptible power supplies. Such applications require detailed and accurate grading of the batteries for so called 'second life' applications in which the SoH of the battery, for typical purposes, is to be determined within an error margin of about +/− 3%. Batteries with a higher SoH command a higher price and can be used for mission critical applications whereas batteries with low state of health can be used in many domestic applications such as back-up power and portable power packs for leisure activities.

Such tests of battery SoH demand high accuracy and precision. Furthermore, particularly for the automotive industry, in which electrically powered cars are becoming more common, precision and repeatability are also important so that the capacity and lifespan of the batteries involved can be accurately analyzed, predicted, and improved. It is desirable to measure the current at a charging or discharging cell to within at least 0.1% accuracy, preferably up to 0.01%, over a wide range of currents.

The state-of-the-art technology to grade batteries typically utilizes one of two conceptually related techniques. For example, batteries are usually discharged to a low threshold voltage at which the state of charge (SoC) is close to or at zero percent (the battery is fully discharged). A full charge-discharge cycle can be used to determine the capacity of the battery using a constant current—constant voltage technique (CC-CV) in which the battery is charged using a constant current at a charging rate (C Rate) suitable for the cell until the cell voltage reaches a threshold value. For many lithium-based cells used in EV applications, the threshold value is typically on the order of 4.2V. Once the cell voltage reaches the threshold value, the charging protocol changes to a constant voltage protocol in which the cell is held at 4.2V and the current is monitored. When the current falls below a threshold value appropriate for the battery, the charging step is stopped. The total charge passed is recorded. The charging step is then repeated, but in this case the battery is discharged with appropriate termination conditions. The total charge is recorded during this step and compared with the charge capacity rating for the cell to determine the State of Health. Tests such as these take at least several hours to perform. This technique also limits the throughput of cells and is therefore not suitable for high capacity processing applications such as second life grading of EV batteries.

EV batteries reaching end-of-service is increasing. These end-of-service batteries typically retain significant capacity and power delivery capability, and their re-use in so-called 'second-life' applications has been proposed as a means to extend the battery value chain, offset a portion of their up-front cost and minimise waste by deferring recycling. Accurate grading of used battery assets is important in order to assign them an appropriate valuation in the second-life market. These grading activities can account for significant costs in repurposing batteries, due largely to the time required for testing, which typically employs DC techniques taking up to several hours to perform a capacity measurement.

Rapid grading methodologies are desired to reduce processing time and achieve the levels of throughput required to handle increasing quantities of end-of-service batteries. Electrochemical impedance spectroscopy (EIS) can be used to determine SoH, offering results in minutes instead of hours. However, it has been found that EIS measurements can be affected by extraneous factors such as temperature, state-of-charge and the experimental setup, and do not provide a direct measurement of capacity. The deployment of EIS for battery grading therefore requires additional approaches in order to eliminate noise factors and ensure robustness to interpret output in terms of capacity.

Example embodiments of the present general inventive concept provide systems and methods for rapid grading of aged automotive Li-ion batteries using EIS and configured to infer the residual capacity of an aged module from a combination of measurements of its EIS spectrum, open-circuit voltage and temperature, using for example, at least in part, a Solartron® impedance analyser.

Other known methods have attempted to use EIS alone to determine the SoH of batteries. However, such attempts have not provided the resolution required for end of life applications.

BRIEF SUMMARY

Example embodiments of the present general inventive concept provide a battery module monitoring and testing system, comprising: an Electrochemical Impedance Spectroscopy (EIS) measuring unit to generate EIS spectra of one or more battery modules; means for fitting the EIS spectra to an equivalent circuit model to establish equivalent circuit parameters; means for measuring an open circuit voltage of the battery modules; means for measuring a temperature of the battery modules; and a processing unit configured to generate weighting parameters of the equivalent circuit fit parameters based on open circuit voltage and temperature measurements of the battery modules, to apply the weighting parameters to the equivalent circuit fit parameters to generate weighted equivalent circuit fit parameters, and to generate a state-of-health (SoH) measurement of the battery modules based on the weighted equivalent circuit fit parameters and EIS spectra.

Example embodiments of the present general inventive concept provide a method of monitoring and testing a battery module, comprising generating EIS of one or more battery modules, fitting the EIS spectra to an equivalent circuit model to establish equivalent circuit fit parameters, measuring an open circuit voltage of the one or more battery modules, measuring a temperature of the one or more battery modules, combining the EIS equivalent circuit fit parameters with measured open circuit and temperature values to determine weighting parameters of the equivalent circuit fit parameters, applying the weighting parameters to the equivalent circuit fit parameters to generate weighted equivalent circuit fit parameters, and generating a state-of-health (SoH) measurement of the one or more battery modules based on the weighted equivalent circuit fit parameters.

Additional features and embodiments of the present general inventive concept will be apparent to those skilled in the art after reading the present disclosure.

BRIEF DESCRIPTION OF THE FIGURES

The following example embodiments are representative of example techniques and structures designed to carry out the objects of the present general inventive concept, but the present example general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Electrochemical impedance spectroscopy (EIS) is a well-established technique for the characterization of electrochemical devices. Briefly, its working principle involves the application of a series of small-amplitude sinusoidal current (or voltage) perturbations to the device under test (DUT), along with measurement of the magnitude and phase shift of its voltage (or current) response to determine its complex impedance at various frequencies. For batteries, the technique is routinely applied in laboratory studies but to date has found limited practical applications in industrial/manufacturing environments. In one such application, EIS was deployed for in-line quality control in a Li-ion battery manufacturing plant, although no estimation of SoH was performed in this case. Practical implementation of EIS for SoH estimation is complicated by the fact that measurements are easily influenced by extraneous factors such as temperature and cable inductance. Previous attempts to estimate battery SoH from EIS data have tended to ignore such effects, leading to methods that require careful temperature control or that are only valid for a particular measurement system. Furthermore, interpretation of impedance data is typically not straightforward; requiring fitting of experimental data to an equivalent circuit model comprised of lumped resistive, capacitive and inductive elements representative of physical processes occurring within the DUT, followed by comparison with electrochemical models in order to estimate relevant figures of merit, e.g. capacity, or electrode composition.

Example embodiments of the present general inventive concept provide a new approach to treatment of extraneous noise factors, whilst dispensing with the need to invoke first-principles electrochemical models for interpretation of EIS data. A novel empirical model was developed, capable of correcting for the influence of temperature and SoC on a battery module's EIS spectrum, thereby enabling direct determination of its SoH based on a single EIS measurement.

In one embodiment of the present general inventive concept, a total of 16 battery modules were taken from 4 used Nissan LEAF battery packs in various states of degradation for use in the study. Each module contained four pouch cells in a 2s2p configuration; each cell having a rated capacity of 35 ampere hours (Ah) when new. Example embodiments of the present general inventive concept focused on grading modules as complete units, rather than on grading individual cells, since the time taken to disassemble modules and retrieve cells would make the process uneconomical, regardless of the time taken for grading.

In one embodiment of the present general inventive concept, residual capacities of the used battery modules were measured by coulometry during a 1 C CC-CV charge/discharge cycle between 0-100% SoC (2.40-4.15V) at 25° C. using a Bitrode module cycler. The cutoff current for the charge/discharge branches was set at 0.5 A. Each 2p pair of cells was measured individually, and the capacity of the module determined by the lower of the two measured capacities, although it was observed that capacity variation between cells within a module fell within the bounds of experimental error, determined in a gauge repeatability and reproducibility study to be ±1.8 Ah.

The modules were found to have capacities in the range 45-64 Ah, corresponding to 69-98% SoH. Another embodiment was to artificially-age a group of modules in order to cover the full range of capacities of interest. For example, ageing can be carried out by cycling at 1.5 C discharge/1C charge between 0-100% SoC, at an ambient temperature of 35° C.

Figure 1:
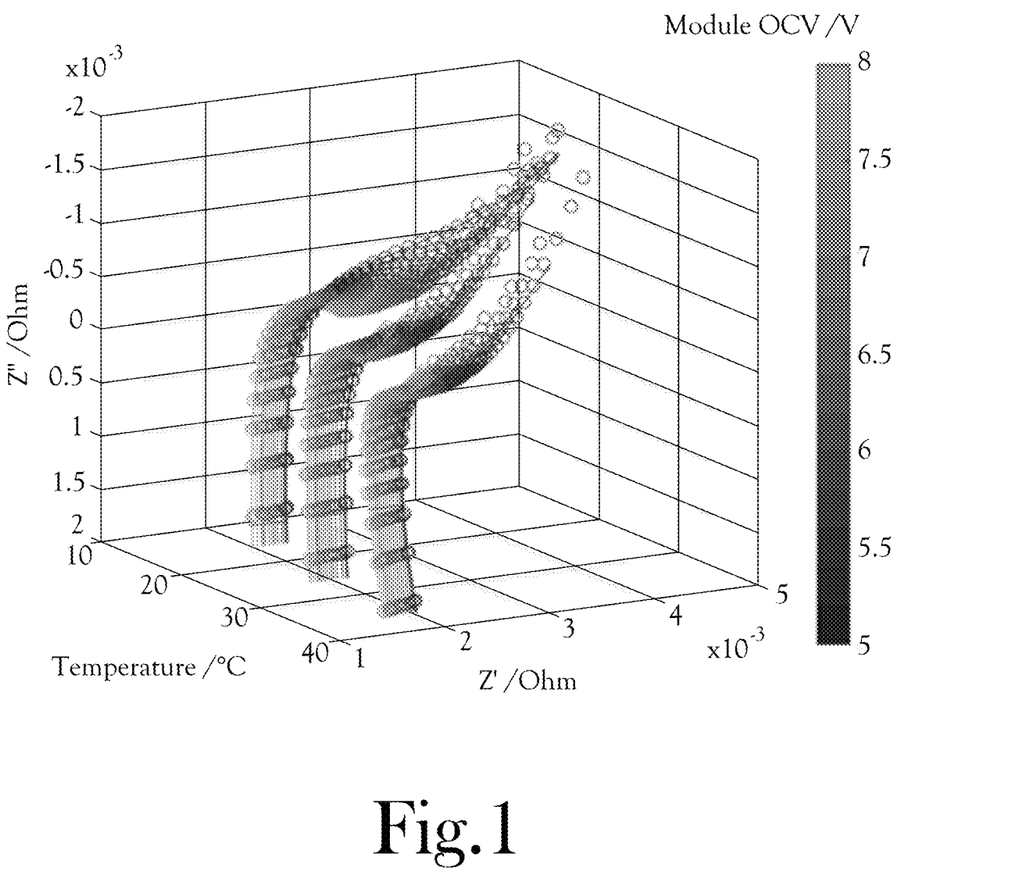
FIG. 1 illustrates a set of EIS spectra data according to an example embodiment of the present general inventive concept.

Example embodiments of the present general inventive concept provided a series of experiments designed to characterize the effect of temperature, SoC and SoH on EIS spectra. A total of 380 EIS spectra were gathered for 8 of the 16 battery modules, at various SoCs ranging from 0-100% and at 3 different temperatures; 15, 25 and 35° C. Temperatures were chosen so as to be representative of the range of temperatures likely to be encountered by modules during storage and handling in the grading facility. Importantly, modules were allowed to equilibrate at open circuit prior to each EIS spectrum for at least 90 minutes following any adjustment of SoC, and for at least 8 hours following any adjustment of temperature to allow for relaxation effects. In this way, each EIS spectrum was recorded with the module in an equilibrated condition, as it would have been following a period of storage in the grading facility. A set of EIS spectra for one of the 8 battery modules is shown in FIG. 1.

In some embodiments of the present general inventive concept, EIS measurements were made using a Solartron® Modulab potentiostat/galvanostat with an FRA card, auxiliary voltage inputs and an external 12V/20A booster. Modules were discharged to 2.4V cell voltage before equilibration for 8 hours at the required temperature. EIS spectra were then recorded under galvanostatic control with a 1A amplitude sinusoidal perturbation at frequencies from 9.9 kHz to 0.06 Hz. State-of-charge was adjusted in 200 mV increments by charging in potentiostatic mode until current fell below 500 mA.

Figure 2:
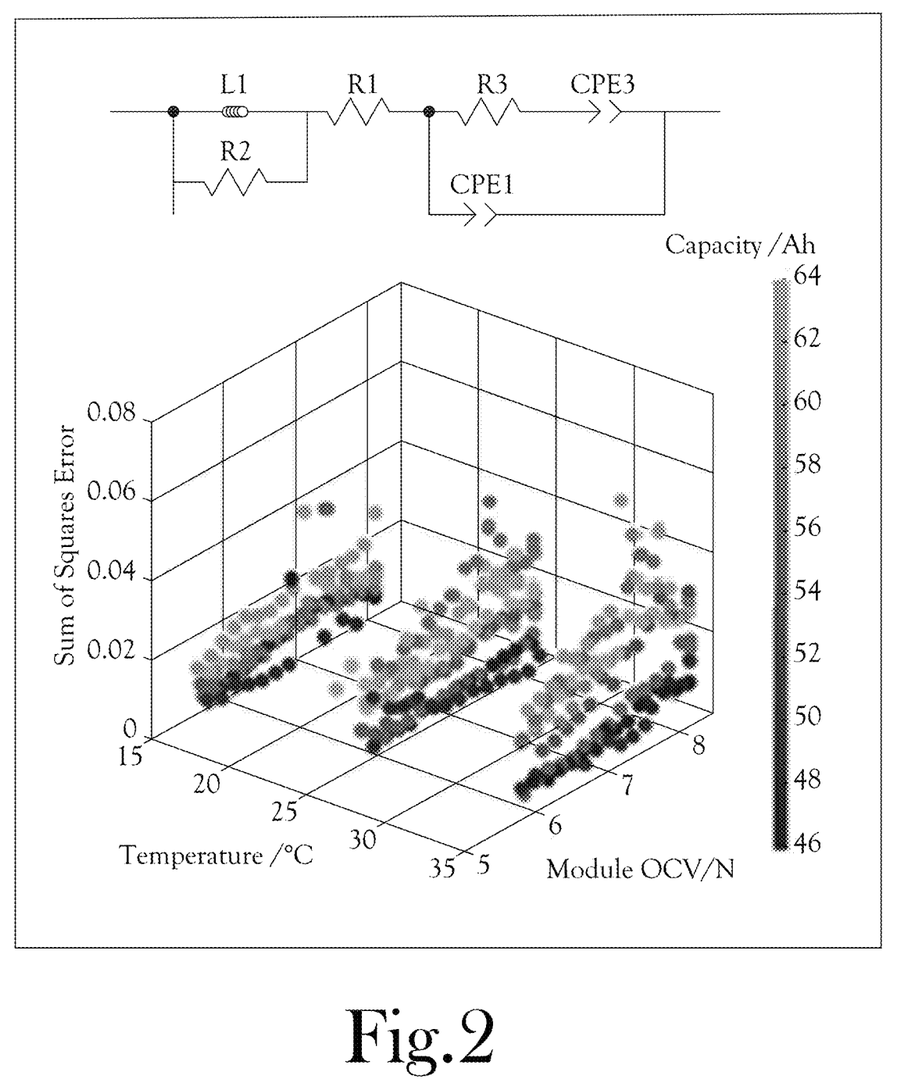
FIG. 2 illustrates an equivalent circuit model and sum-of-squares residuals from an equivalent circuit fitting according to an example embodiment of the present general inventive concept.

EIS spectra were fitted to the equivalent circuit model shown in the top section of FIG. 2 using equivalent circuit modeling tools. The equivalent circuit parameters were configured such that a good fit (<5% error in any equivalent circuit parameter) could be obtained regardless of module SoC, SoH and temperature. The constant phase elements CPE1 and CPE3 represent double-layer capacitance and diffusion behaviors, respectively. The L1 and R3 elements were introduced as a means to correct for the influence of cable inductance. R1 represents the series Ohmic resistance and R2 represents charge transfer at both electrodes. Whereas some studies employing EIS aim to relate equivalent circuit elements directly to physical and electrochemical processes or characteristics, this is of lesser importance in this study. In the current embodiment the approach was for the equivalent circuit configuration to accurately describe and parameterize the I-V transfer function of the battery module over the measured frequency range. The bottom section of FIG. 2 shows the sum-of-squares of residuals from an equivalent circuit fitting for all EIS spectra as a function of temperature, SoC and SoH, and demonstrating a good fit in all cases (<6% overall error).

The significance of the equivalent circuit parameters is realized by configuring the fitting means to relate the parameters back to module capacity (in units of Ah) using empirical data. To configure the fitting means, in one embodiment, a weighted least-squares regression analysis was performed considering equivalent circuit parameters along with open circuit voltage and temperature as model predictors, and measured DC capacities as responses. In order to account for heteroscedasticity in the predictor variables, the analysis was weighted according to the reciprocal of the sum-of-squares of residuals computed for each EIS spectral fit. The weighting of each EIS spectrum within the system is indicated by the size of each marker in FIG. 3. Terms up to second order were included in the analysis, along with interaction terms for each pair of predictors. Stepwise selection of terms was employed to remove any terms whose p-value exceeded 0.15, indicating low significance.

To account for a known non-linear interaction between the R3 and CPE1 parameters, whilst reducing the number of degrees-of-freedom of the system, the effective time constant $RC_{eff}$ of the R3-CPE1 combination was computed and configured according to equation (1) and included as a predictor in the system in place of the individual CPE1-T and CPE1-P parameters, $$RC_{eff} = (CR)^{1/n} \quad (1)$$

with C being the CPE1-T value, n the CPE1-P parameter and R the R3 resistance.

Figure 4:
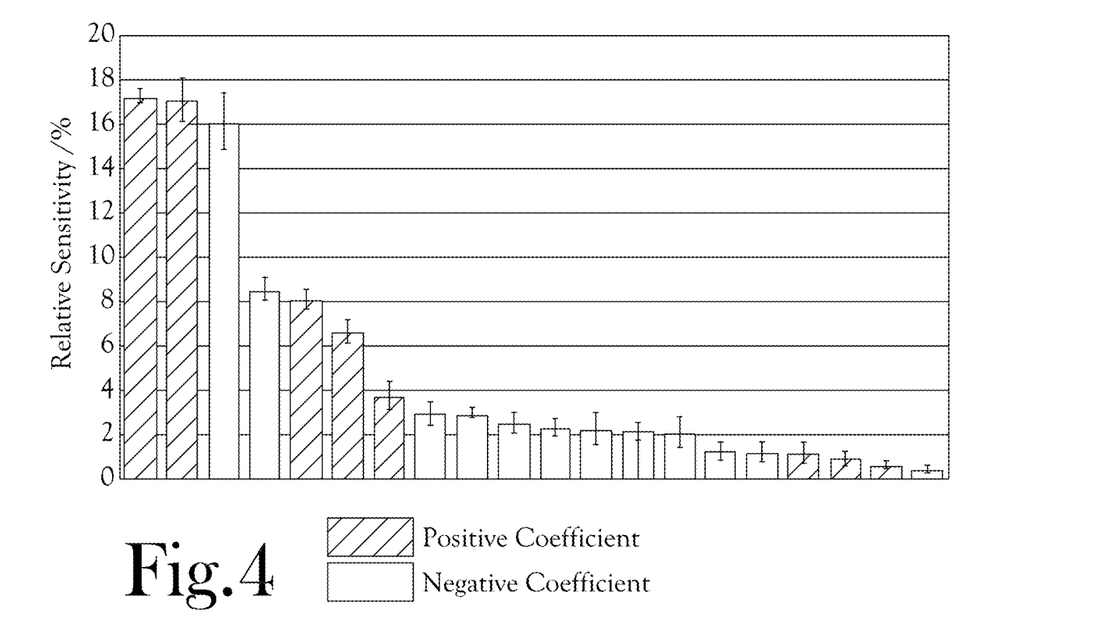
FIG. 4 illustrates contributions to the relevant terms of the equivalent circuit model according to an example embodiment of the present general inventive concept.
Figure 5:
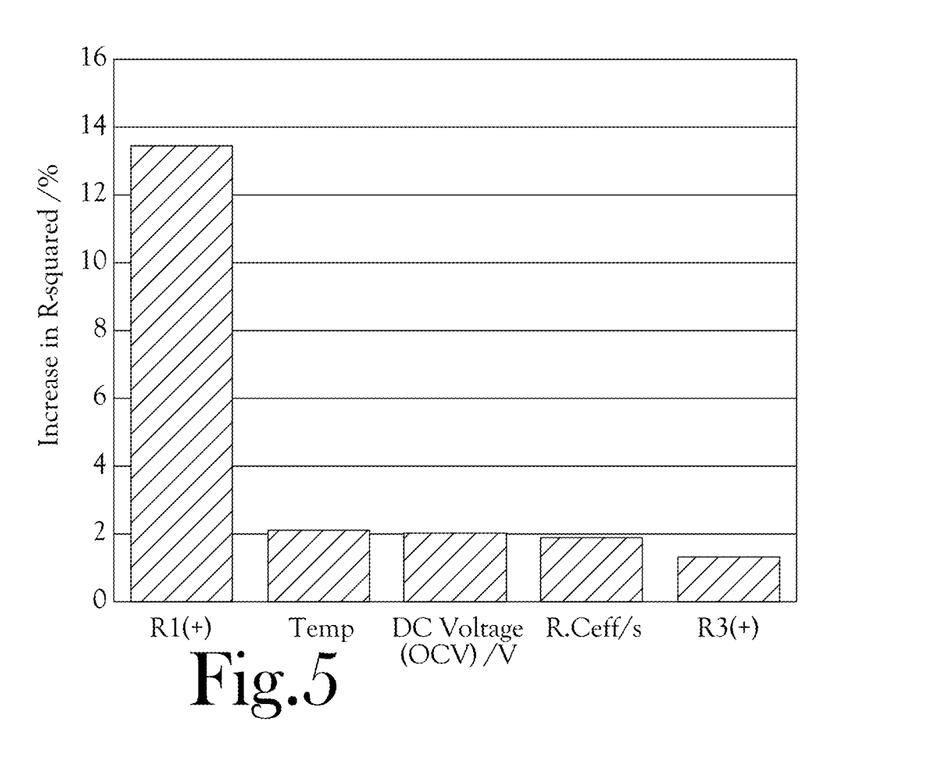
FIG. 5 illustrates contributions to the relevant terms of the equivalent circuit model according to an example embodiment of the present general inventive concept.

The empirical factors arising from the regression analysis described above contained N=21 terms, whose contributions are compared in FIGS. 4 and 5. The sensitivity data $S_i$ in FIG. 4 were calculated from standardized coefficients $\gamma_i$ according to equation (2) and reveal that the system is most sensitive to variations in R1, R3 and $RC_{eff}$ predictors, followed by a significant interaction between temperature and the $RC_{eff}$ time constant.

$$S_i = \gamma_i / \Sigma_{i=1}^N \gamma_i^N \times 100\% \quad (2)$$

Significant sensitivities toward temperature and OCV (SoC) may also be apparent as shown in FIG. 4. Given that these two parameters were varied in the experiments to cover their full range of interest, and are therefore at maximum variance in the system, it is noteworthy that they have lower sensitivity than the EIS-derived predictors.

The signs of all coefficients (indicated by FIG. 4) agree qualitatively with expectations based on electrochemical theory and observations from previous work. For instance, the negative coefficient for the R1 predictor (Ohmic resistance) is in agreement with the observation that Ohmic resistance generally increases as capacity decreases upon ageing. Likewise, charge transfer resistance predictor R3 also displays the expected negative correlation with capacity due to slowing electrode kinetics and loss of surface area with ageing.

FIG. 5 offers an alternative view of the influence of each predictor on the model output, showing the increment in R-squared upon introduction of each predictor to a model already containing the others. The R1 parameter offers by far the largest R-squared increment and therefore was found to account for the most significant portion of unique variance observed in DC capacity data. This indicates a strong correlation between growth of Ohmic resistance and capacity fade during ageing. Meanwhile, the importance of including temperature and OCV as predictors in the regression model is highlighted by their incremental effect on R-squared placing second and third to that of R1, respectively.

Figure 3:
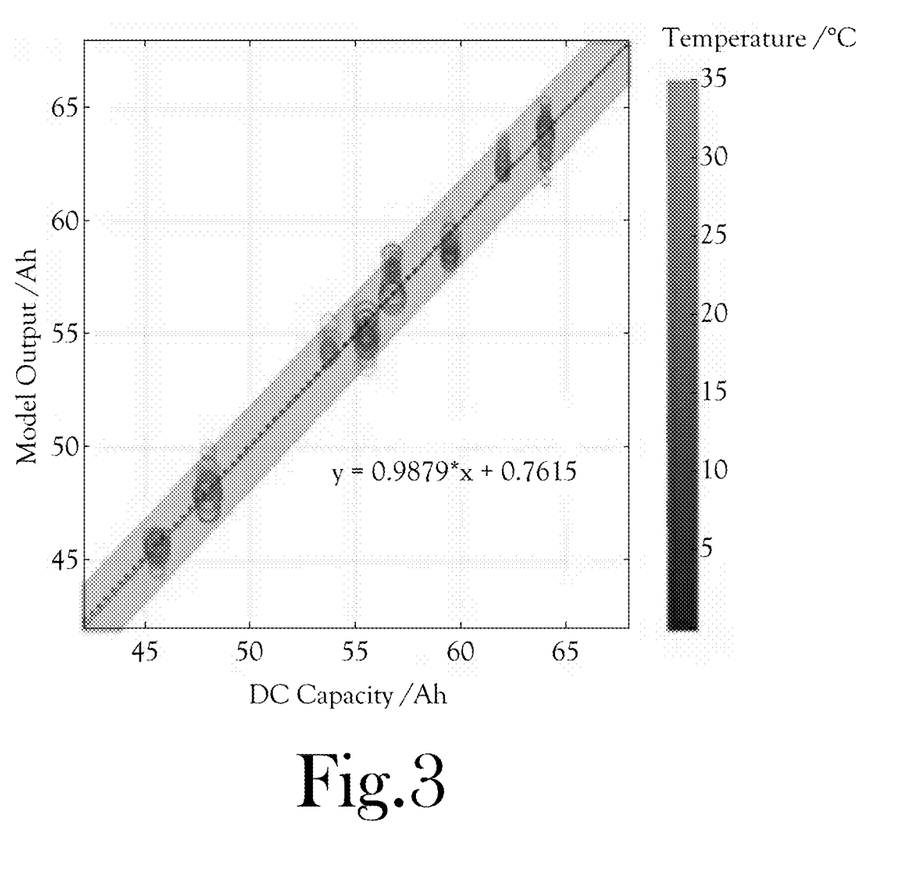
FIG. 3 illustrates the weighting of each EIS spectrum according to an example embodiment of the present general inventive concept.

Example embodiments of the present general inventive concept provide a regression module configured to fit to the training dataset as illustrated in FIG. 3. Analysis of variance indicated an adjusted R-squared value of 98.46%. For example, the system gave a RMSE residual of 0.85 Ah (1.3% SoH) toward the training dataset.

In another embodiment, a second set of 8 aged battery modules was employed. The modules were adjusted to random states of charge prior to grading. EIS spectra were recorded over the same frequency range and using the same perturbation amplitude as the previous experiments used to train the empirical system, but using a different instrument such as Solartron® EnergyLab XM. Measurements were repeated at various SoCs from 10-90%, and various temperatures in the range 15-35° C., including intermediate temperatures of 20° C. and 30° C. The DC capacities predicted by the system were compared with measured DC capacities in FIG. 6. The error bars represent the range of capacity values output by the system based on several EIS measurements made on each module over a range of SoCs from 10-90%, and temperatures from 15-35° C. These errors fall on the whole within the ±1.8 Ah experimental error band of the DC capacity test, represented by the shaded diagonal regions in FIGS. 3 and 6.

Figure 6:
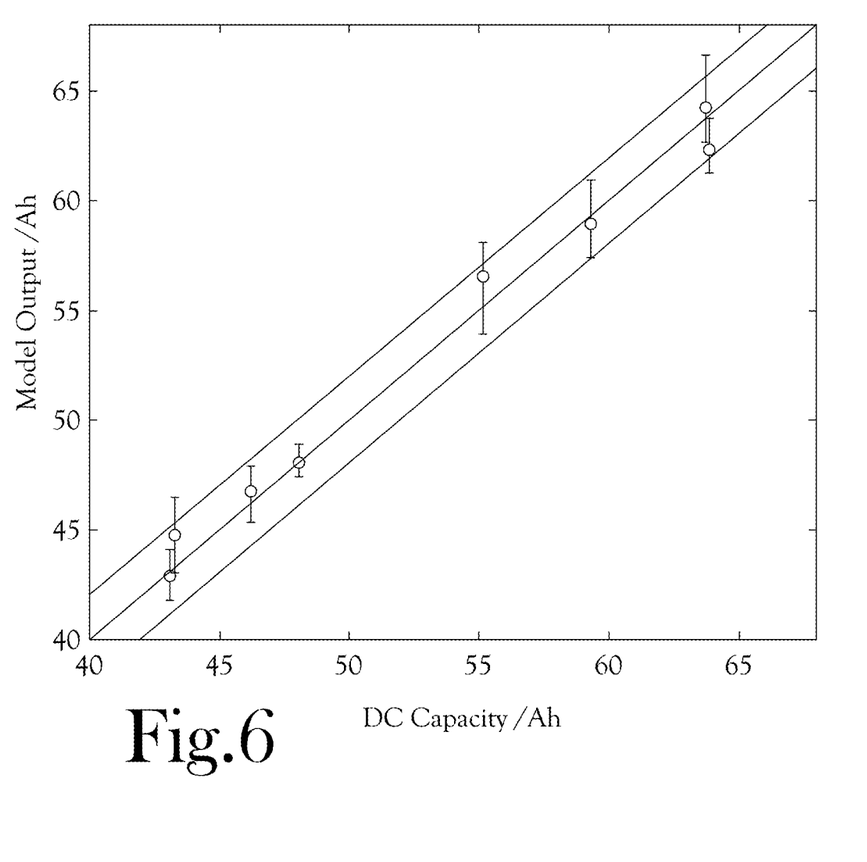
FIG. 6 illustrates outliers to the equivalent circuit model according to an example embodiment of the present general inventive concept.
Figure 7:
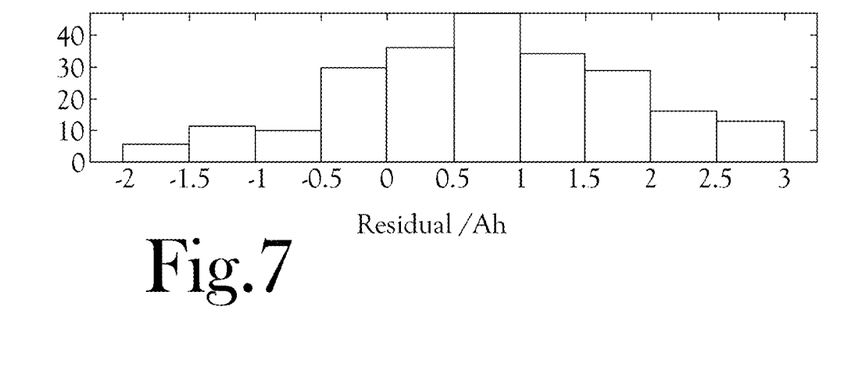
FIG. 7 illustrates excluding the outliers of the equivalent circuit model according to an example embodiment of the present general inventive concept.

The outliers shown in FIG. 6 were found to be due to insufficient equilibration time between adjusting temperature and/or SoC prior to running EIS measurements. This finding highlights the importance of ensuring the DUT is at thermal and electrochemical equilibrium prior to grading, and has implications for the practical implementation of the method in a production facility: it was found that modules could be set aside for a period of at least 3 hours following discharge to 15% SoC and removal from a pack in order to ensure that this condition is met. The grading facility can also be reasonably-well thermostated (temperature fluctuation of less than ±1° C. per hour as a guideline) in order to avoid temperature gradients within modules. Excluding these outliers, as shown in FIG. 7, the RMSE residual for the model prediction was found by the system to be ±1.4 Ah, which compares favorably with the error in the DC capacity measurement. The residuals are skewed by approximately +0.75 Ah, indicating a tendency towards over-estimation of capacity. This may be an artifact of differences in experimental setup between the training and validation experiments, but nonetheless the errors remain within acceptable limits.

Example embodiments of the present general inventive concept described herein are configured to determine the residual capacity of a battery module in less than 3 minutes, with an RMSE error of ±1.4 Ah (2.2% SoH) versus the equivalent DC capacity test, which itself would require up to 3 hours to complete. The application of a weighted regression analysis to a dataset generated via a multi-factorial experimental design as implemented by embodiments of the present general inventive concept can be an efficient means to determine the correlations and interactions between EIS equivalent circuit parameters, temperature, SoC and SoH without the need for first-principles electrochemical modeling.

Example embodiments of the present general inventive concept afford up to a 98% reduction in the time required for grading a used battery, and are applicable in principle to any Li-ion chemistry, cell or module design. The systems and methods of the present general inventive concept are scalable to high-volume commercial operations, with throughput limited only by the number of low-current (1 Apk AC up to 10 kHz), EIS-capable channels installed in a grading facility. The cost of such channels is lower than that of the high-power test channels required for the equivalent DC test—especially for large format cells and modules requiring large DC charge and discharge currents.

Example embodiments of the present general inventive concept have been shown to be valid for the 1st generation Nissan Leaf module (32.5 Ah cells configured in a 2s2p topology, with LMO cathode chemistry). It is important to note that any changes to cell chemistry, design or module topology, such as in the 3rd generation (NMC cathode chemistry) and 5th generation (3 module variants with different topologies) may be analyzed by repeating the processing on each variant in order to configure the empirical systems for each.

Example embodiments of the present general inventive concept provide systems and methods configured to account for temperature of measurement and the SoC of the cell when utilizing equivalent circuit analysis to determine the SoH of a Battery. The systems are configured to provide for the prediction of capacity from EIS measurements on used battery modules. Some embodiments utilized standard shunt-based pstat systems, but the present general inventive concept is not limited thereto. For example, it is possible to integrate a multi-range Flux Gate sensor for EIS measurements, and a 5-channel EIS, 3 kW, 10V Module Cycler may be utilized. Other known or later developed EIS measurement systems may also be used without departing from the scope of the present general inventive concept.

Example embodiments of the present general inventive concept provide a battery module monitoring and testing system. While devices under test in the present study included generation 1 NISSAN LEAF battery modules, the systems and methods of the present general inventive concept are not limited thereto and can be configured to apply to a wide range of battery generations and/or other types of battery modules.

Example embodiments of the present general inventive concept have been configured to determine SoH by utilizing 3 measurements, but the present general inventive concept is not limited thereto:

Two electrode, 4 terminal Electrochemical EIS measurements using a ac amplitude of 1 amp RMS from 10 kHz to 100 mHz;

Measurement of the Open circuit voltage of the module; and

Measurement of the module temperature at test (measured on the surface of the module).

The Electrochemical impedance data are fitted to an electrical equivalent circuit model in which various passive circuit elements are configured to represent equivalent electrochemical responses in the cell. It has been found that removing 'noise factors' such as open circuit voltage (SoC) and temperature from EIS measurements alone of the battery-under-test can account for amongst other parameters variabilities in the State of Charge of batteries at sorting facilities/incoming goods and the temperature of measurement, in order to provide predictive analysis within the required tolerances.

Those skilled in the art will readily appreciate that example embodiments of the present general inventive concept can be achieved by providing a battery module monitoring and testing system, including an EIS measuring unit to generate EIS spectra data of a battery module, means for fitting the EIS spectra data to an equivalent circuit model to establish equivalent circuit fit parameters, means for measuring an open circuit voltage of the battery module, means for measuring a temperature of the battery module, and a processing unit configured to generate weighting parameters of the equivalent circuit fit parameters based on open circuit voltage and temperature measurements of the battery module, to apply the weighting parameters to the equivalent circuit fit parameters to generate weighted equivalent circuit fit parameters, and to generate an SoH measurement of the battery module based on the weighted equivalent circuit fit parameters and EIS spectra data.

Example embodiments of the present general inventive concept can also be achieved by providing a method of monitoring and testing a battery module, including generating EIS data of a battery module, fitting the EIS data to an equivalent circuit model to establish equivalent circuit fit parameters, measuring an open circuit voltage of the battery module, measuring a temperature of the battery module, combining the EIS equivalent circuit fit parameters with measured open circuit and temperature values to determine weighting parameters of the equivalent circuit fit parameters, applying the weighting parameters to the equivalent circuit fit parameters to generate weighted equivalent circuit fit parameters, and generating a SoH measurement of the battery module based on the weighted equivalent circuit fit parameters.

In some embodiments incorporating a test fixture, small resistive offsets may be apparent due to additional contact and cable resistances, but these offsets can be easily corrected for using the example systems and methods described herein.

The systems and methods of the present general inventive concept can be configured using data derived from numerous used battery modules covering a range of SOH. EIS measurements can be recorded under different conditions and implemented in the system in order to understand and correct for the influence of key noise factors. It was found that SoH of a vehicle battery can be determined in minutes using the systems and methods of the present general inventive concept, instead of hours using traditional DC techniques, with no loss of accuracy, repeatability or reproducibility. Reduction of characterization time in this way affords a corresponding reduction in repurposing costs, thus improving the viability of battery re-use as part of the circular economy.

Example embodiments have been shown to reproduce SoH measurements as determined by charge/discharge capacity measurements to within 0.5%, which is within the measurement errors of the instruments used in the tests, thus verifying the equivalence of the present general inventive concept with the state-of-the-art grading methods, yet reducing the test time from about 3 hrs to 3 mins or less with no loss in grading resolution.

As described, the systems, apparatus, methods, processes, functions, and/or operations for implementing the example embodiments of the present general inventive concept may be wholly or partially implemented in the form of apparatus that includes processing elements and sets of executable instructions. The executable instructions may be part of one or more software applications and arranged into software architecture. In general, embodiments of the present general inventive concept may be implemented using a set of software instructions that are designed to be executed by a suitably programmed processing element (such as a CPU, GPU (graphics processing unit), microprocessor, processor, controller, computing device, etc.). In a complex application or system such instructions are typically arranged into "modules" with each such module typically performing a specific task, process, function, or operation. The entire set of modules may be controlled or coordinated in their operation by an operating system (OS) or other form of organizational platform.

The application models may include any suitable computer executable code or set of instructions (e.g., as would be executed by a suitably programmed processor, microprocessor, or CPU), such as computer-executable code corresponding to a programming language. For example, programming language source code may be compiled into computer-executable code. Alternatively, or in addition, the programming language may be an interpreted programming language such as a scripting language. The computer-executable code or set of instructions may be stored in (or on) any suitable non-transitory computer-readable medium. In general, with regards to the embodiments described herein, a non-transitory computer-readable medium may include almost any structure, technology or method apart from a transitory waveform or similar medium.

As described, the systems, apparatus, methods, processes, functions, and/or operations for implementing the example embodiments of the present general inventive concept may be wholly or partially implemented in the form of a set of instructions executed by one or more programmed computer processors such as a central processing unit (CPU) or microprocessor. Such processors may be incorporated in or in the circuitry and components of an apparatus, server, client or other computing or data processing device operated by, or in communication with, other components of the system.

It should be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components, processes, models, or functions described in this application may be implemented as software code to be executed by a processor using any suitable computer language such as, for example, Java, JavaScript, C++ or Perl using, for example, conventional or object-oriented techniques. The software code may be stored as a series of instructions, or commands in (or on) a non-transitory computer-readable medium, such as a random-access memory (RAM), a read only memory (ROM), a magnetic medium such as a hard-drive or a floppy disk, or an optical medium such as a CD-ROM. In this context, a non-transitory computer-readable medium is almost any medium suitable for the storage of data or an instruction set aside from a transitory waveform. Any such computer readable medium may reside on or within a single computational apparatus, and may be present on or within different computational apparatuses within a system or network.

According to some example implementations, the term processing unit or processor, as used herein, may be a central processing unit (CPU), or conceptualized as a CPU (such as a virtual machine). In such example implementation, the CPU or a device in which the CPU is incorporated may be coupled, connected, and/or in communication with one or more peripheral devices such as the EIS measuring unit, as well as one or more displays. In other example implementations, the processing unit or processor may be incorporated into a mobile computing device, such as a smartphone or tablet computer.

The non-transitory computer-readable storage medium referred to herein may include a number of physical drive units, such as a redundant array of independent disks (RAID), a floppy disk drive, a flash memory, a USB flash drive, an external hard disk drive, thumb drive, pen drive, key drive, a High-Density Digital Versatile Disc (HD-DVD) optical disc drive, an internal hard disk drive, a Blu-Ray optical disc drive, or a Holographic Digital Data Storage (HDDS) optical disc drive, synchronous dynamic random access memory (SDRAM), or similar devices or other forms of memories based on similar technologies. Such computer readable storage media allow the processing element or processor to access computer-executable process steps, application programs and the like, stored on removable and non-removable memory media, to off-load data from a device or to upload data to a device. As mentioned, with regards to the embodiments described herein, a non-transitory computer-readable medium may include almost any structure, technology or method apart from a transitory waveform or similar medium.

Certain implementations of the disclosed technology are described herein with reference to block diagrams of systems, and/or to configurations, functions, processes, or methods. It will be understood that one or more of the configurations, methods, processes, and functions can be implemented by computer-executable program instructions. Note that in some embodiments, one or more of the configurations, methods, processes, systems, and functions may not necessarily need to be performed in a particular order, or may not necessarily need to be performed at all.

These computer-executable program instructions may be loaded onto a general-purpose computer, a special purpose computer, a processor, or other programmable data processing apparatus to produce a specific example of a machine, such that the instructions that are executed by the computer, processor, or other programmable data processing apparatus create means for implementing one or more of the functions, operations, processes, systems, or methods described herein.

These computer program instructions may also be stored in a computer-readable memory that can direct a computer or other programmable data processing apparatus to function in a specific manner, such that the instructions stored in the computer-readable memory produce an article of manufacture including instruction means that implement one or more of the functions, operations, processes, or methods described herein.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

It is noted that the simplified diagrams and drawings included in the present application do not illustrate all the various connections and assemblies of the various components, however, those skilled in the art will understand how to implement such connections and assemblies, based on the illustrated components, figures, and descriptions provided herein, using sound engineering judgment.

Numerous variations, modification, and additional embodiments are possible, and, accordingly, all such variations, modifications, and embodiments are to be regarded as being within the spirit and scope of the present general inventive concept.

The invention claimed is:

1. A battery module monitoring and testing system, comprising:
    an Electrochemical Impedance Spectroscopy (EIS) measuring unit to generate EIS spectra of one or more battery modules;
    means for fitting the EIS spectra to an equivalent circuit model to establish equivalent circuit parameters;
    means for measuring an open circuit voltage of the one or more battery modules;
    means for measuring a temperature of the battery modules; and
    a processing unit configured to generate weighting parameters of the equivalent circuit fit parameters based on open circuit voltage and temperature measurements of the one or more battery modules, to apply the weighting parameters to the equivalent circuit fit parameters to generate weighted equivalent circuit fit parameters, and to generate a state-of-health (SoH) measurement of the one or more battery modules based on the weighted equivalent circuit fit parameters and EIS spectra.

2. The battery module monitoring and testing system according to claim 1, wherein the means for fitting the EIS spectra is configured to perform a weighted least-squares regression analysis to relate the equivalent circuit parameters back to the SoH measurement of the one or more battery modules.

3. The battery module monitoring and testing system according to claim 1, wherein the processing unit is configured to apply the open circuit voltage and temperature based on measured DC capacities.

4. The battery module monitoring and testing system according to claim 1, wherein the processing unit is configured to determine a residual capacity of the one or more battery modules.

5. The battery module monitoring and testing system according to claim 4, wherein the residual capacity of the one or more battery modules is determined based on coulometry measurements during a 1C CC-CV charge/discharge cycle between 0-100% state-of-charge (SoC).

6. The battery module monitoring and testing system according to claim 5, wherein the processing unit is configured to use measurements of a Bitrode module cycler to determine the residual capacity.

7. The battery module monitoring and testing system according to claim 1, wherein at least one of the one or more battery modules were artificially aged to generate battery modules within a range of 69-98% SoH.

8. The battery module monitoring and testing system according to claim 1, wherein the processing unit is configured to generate the weighting parameters based on multiple EIS spectra measured from the one or more battery modules at state-of-charge (SoC) capacities from 0-100%.

9. The battery module monitoring and testing system according to claim 1, wherein the EIS spectra are measured at temperatures of 15, 25, and 35 degrees Centigrade.

10. The battery module monitoring and testing system according to claim 1, wherein the EIS measuring unit is configured to generate EIS spectra delayed for at least 90 minutes following an adjustment of SoC and for at least 8 hours following an adjustment of temperature to allow the battery modules to equilibrate at open circuit.

11. The battery module monitoring and testing system according to claim 1, wherein the EIS measuring unit comprises a Solarton Modulab potentiostat/galvanostat with an FRA card, auxiliary voltage inputs and an external 12V/20A booster.

12. The battery module monitoring and testing system according to claim 10, wherein the one or more battery modules were discharged to 2.4V before the 8 hour temperature equilibration.

13. The battery module monitoring and testing system according to claim 1, wherein the EIS measuring unit is configured to record EIS spectra with a 1A sinusoidal perturbation, at frequencies from 9.9 kHz to 0.06 Hz, and SoC adjusted in 200 mV increments until current falls below 500 mA.

14. The battery module monitoring and testing system according to claim 1, where the processing unit is configured to record sum-of-squares residuals for all EIS spectra as a function of temperature, state-of-charge (SoC) and SoH.

15. The battery module monitoring and testing system according to claim 14, wherein the processing unit is configured to weight the EIS spectra according to the reciprocal of the sum-of-squares residuals to account for heteroscedasticity.

16. A method of monitoring and testing a battery module, comprising:
    generating EIS Spectra of one or more battery modules;
    fitting the EIS spectra to an equivalent circuit model to establish equivalent circuit fit parameters;

measuring an open circuit voltage of the one or more battery modules;

measuring a temperature of the one or more battery modules;

combining the EIS equivalent circuit fit parameters with measured open circuit voltage and temperature values to determine weighting parameters of the equivalent circuit fit parameters;

applying the weighting parameters to the equivalent circuit fit parameters to generate weighted equivalent circuit fit parameters; and generating a state-of-health (SoH) measurement of the one or more battery modules based on the weighted equivalent circuit fit parameters.

17. The method of monitoring and testing a battery module according to claim 16, wherein a weighted least-squares regression analysis is performed to generate an empirical model relating the equivalent circuit parameters back to a SoH measurement of the one or more battery modules.

18. The method of monitoring and testing a battery module according to claim 17, wherein the open circuit voltage and temperature values are used as model predictors, and measured DC capacities are used as responses in the empirical model.

* * * * *